United States Patent
Honore et al.

(10) Patent No.: US 10,524,521 B2
(45) Date of Patent: Jan. 7, 2020

(54) REMOVABLE ELECTRONIC SYSTEM FOR ACTIVATING THE DEPLOYMENT OF AN INFLATABLE SAFETY VEST

(71) Applicant: IN&MOTION, Chavanod (FR)

(72) Inventors: Valentin Honore, Annecy (FR); Pierre-François Tissot, Chignin (FR); Rémi Thomas, Annecy le Vieux (FR)

(73) Assignee: IN&MOTION, Chavanod (FR)

( * ) Notice: Subject to any disclaimer, the term of this patent is extended or adjusted under 35 U.S.C. 154(b) by 192 days.

(21) Appl. No.: 15/547,170

(22) PCT Filed: Jan. 28, 2016

(86) PCT No.: PCT/FR2016/050184
§ 371 (c)(1),
(2) Date: Jul. 28, 2017

(87) PCT Pub. No.: WO2016/120568
PCT Pub. Date: Aug. 4, 2016

(65) Prior Publication Data
US 2018/0020748 A1    Jan. 25, 2018

(30) Foreign Application Priority Data
Jan. 28, 2015 (FR) .................................. 15 50656

(51) Int. Cl.
*H05K 5/00* (2006.01)
*A41D 13/018* (2006.01)
(Continued)

(52) U.S. Cl.
CPC ........... *A41D 13/018* (2013.01); *A41D 1/002* (2013.01); *A41D 1/04* (2013.01); *H05K 5/0217* (2013.01); *A41D 2600/10* (2013.01)

(58) Field of Classification Search
USPC ................................................... 361/679.01
See application file for complete search history.

(56) References Cited

U.S. PATENT DOCUMENTS

4,977,623 A * 12/1990 DeMarco ............. A41D 13/018
2/456
2002/0118109 A1  8/2002 Hilliard et al.
(Continued)

FOREIGN PATENT DOCUMENTS

DE    3010842 A1    10/1981
EP    2033532 A1    3/2009
(Continued)

OTHER PUBLICATIONS

International Search Report dated May 23, 2016 of corresponding International application No. PCT/FR2016/050184; 8 pgs.

*Primary Examiner* — Rodney E Fuller
(74) *Attorney, Agent, or Firm* — Maier & Maier, PLLC

(57) ABSTRACT

Disclosed is a system (1) for activating the deployment of an inflatable safety vest, characterised in that it comprises a case (2) designed to be solidly connected to the inflatable safety vest and equipped with a first opening (21) into which a box (3) can be removably inserted, said box comprising at least an electronic card, connection means and an energy-storage device. The upper part of the aforementioned first opening (21) is provided with a housing (22) which is equipped on the base and connected to the case (2) and into which at least the upper part (31) of the box (3) can be inserted so that it is hermetically connected to the case (2).

10 Claims, 1 Drawing Sheet

(51) Int. Cl.
*A41D 1/00* (2018.01)
*A41D 1/04* (2006.01)
*H05K 5/02* (2006.01)

(56) References Cited

U.S. PATENT DOCUMENTS

| | | | |
|---|---|---|---|
| 2007/0075528 A1* | 4/2007 | Makabe | A41D 13/018 280/730.1 |
| 2014/0172134 A1* | 6/2014 | Meschter | G01L 1/205 700/91 |
| 2016/0174626 A1* | 6/2016 | Mazzarolo | A41D 13/018 2/455 |
| 2018/0220543 A1* | 8/2018 | Hibino | H05K 5/0004 |
| 2018/0295897 A1* | 10/2018 | Donohoe | A41D 1/002 |

FOREIGN PATENT DOCUMENTS

| | | | |
|---|---|---|---|
| EP | 2745720 A1 | 6/2014 | |
| FR | 2936470 A1 | 4/2010 | |

* cited by examiner

REMOVABLE ELECTRONIC SYSTEM FOR ACTIVATING THE DEPLOYMENT OF AN INFLATABLE SAFETY VEST

CROSS-REFERENCE TO RELATED APPLICATIONS

This application claims priority to PCT Application No. FR2016/050184 filed Jan. 28, 2016.

TECHNICAL DOMAIN

This invention relates to the domain of preventing injuries related to falls when skiing in general and more particularly an electronic system for activating the deployment of an inflatable safety vest.

PRIOR ART

With the increasingly widespread practice of skiing and particularly "extreme" skiing such as off-trail skiing and skiing for alpine skiing competitions or ski cross inspired from motocross, attempts have been made to develop systems designed to protect skiers when they fall and more specifically the most exposed parts of their body, for example such as the nape of the neck, the thorax, the spinal column, the abdomen and the hips.

Thus, "passive" protections have been developed including semi-rigid stiffeners worn by the skier under his or her ski suit. There is no doubt that these protections are efficient but they have the major disadvantage that they restrict the skier's movements and therefore limit his or her performances.

"Active" protections have been produced to overcome this disadvantage. This type of protection is conventionally composed of a very compact inflatable vest that can very quickly be inflated by a gas as a skier is falling, to prevent violent contact with the ground during the fall. Operation of this vest that comprises an inflatable envelope and a deployment system fixed to said envelope and capable of triggering inflation of the envelope is similar to the operation of airbags installed in vehicles.

One of the main problems encountered during the development of these active protections is the development of systems for activation of deployment of said inflatable safety vest, because these systems that contain at least sensors, microprocessors, memories, a wireless communication module, inflation means capable of inflating said envelope, a user interface and an energy storage device advantageously of the rechargeable type, must measure the user's movements in real time using an algorithm and decide to activate deployment of the safety vest under identified situations. These operations have high energy needs that significantly limit the endurance of the activation system and therefore the inflatable safety vest and require frequent recharging that immobilises the vest, making it unusable. Furthermore, activation strategies are likely to change and be refined over time (revisions to the algorithm, new sensors, etc.), therefore it is important to be able to easily upgrade the triggering system, both in its software and its hardware, taking account of severe usage conditions, namely high relative humidity, very low temperatures and frequent shocks.

PRESENTATION OF THE INVENTION

Therefore the purpose of this invention is to mitigate the disadvantages mentioned above and to disclose a reliable system for activating a deployment system for an inflatable safety vest for a skier, and that in particular is resistant to extreme conditions of use, easy to manufacture and to use, to maintain and upgrade its software and hardware.

Therefore according to the first purpose of the invention, a system is disclosed for activating the deployment of an inflatable safety vest, remarkable in that it comprises a case designed to be fixed to said inflatable safety vest and equipped with a first opening into which a box can be removably inserted, said box comprising at least one electronic card, connection means and an energy storage device, the upper part of said first opening being provided with a housing on the bottom of which there are means for connecting the case and into which at least the upper part of the box can be inserted so that it is hermetically connected to said case.

Said connection means of the case are preferably associated with sealing elements made from plastic and foam shapes.

Advantageously, the first opening comprises support rails on each side of the first opening, to support the box at the bottom of said first opening and sliding of the box so that it can be inserted in the housing, and a flexible attachment element located in the bottom part of the first opening and locking said box in the inserted position.

The box comprises attachment elements designed to cooperate with and to be inserted in the case support rails.

According to one preferred embodiment, the shape of the upper part of the box is asymmetric so that it is only possible to position it and insert it in one direction.

The asymmetric shape of the top part of the box is advantageously at least partly repeated on a pattern made on the case.

The box connection means are located on the top part and their shape is complementary to the shape of sealing elements of the case.

Preferably, the case is fixed to a dorsal protection made of an absorbent material arranged to be fixed on said inflatable safety vest behind the lumbar vertebrae of a skier when the skier is wearing said safety vest.

Said case also comprises a second opening into which inflation means can be reversibly fitted, to generate or release gas to enable deployment of the safety vest, said inflation means preferably being a compressed gas cartridge.

BRIEF DESCRIPTION OF THE FIGURES

Other advantages and characteristics will become clearer after reading the following description of a particular embodiment given as a non-limitative example of a system for activating the deployment of an inflatable safety vest for a skier according to the invention, with reference to the drawings in which.

BEST METHOD FOR IMPLEMENTING THE TECHNICAL INVENTION

Figure 1:
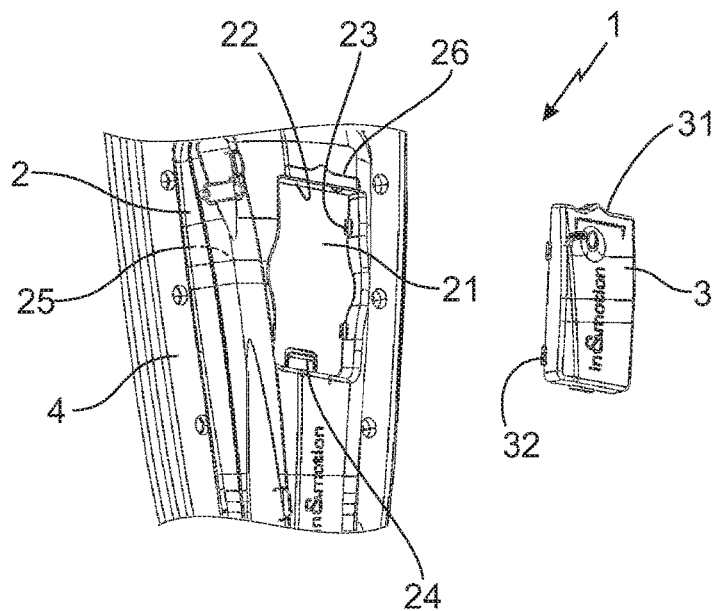
FIGS. 1 to 3 are partial perspective views showing different steps in the assembly of two main elements forming the activation system for deployment of an inflatable safety vest for a skier according to the invention.
Figure 2:
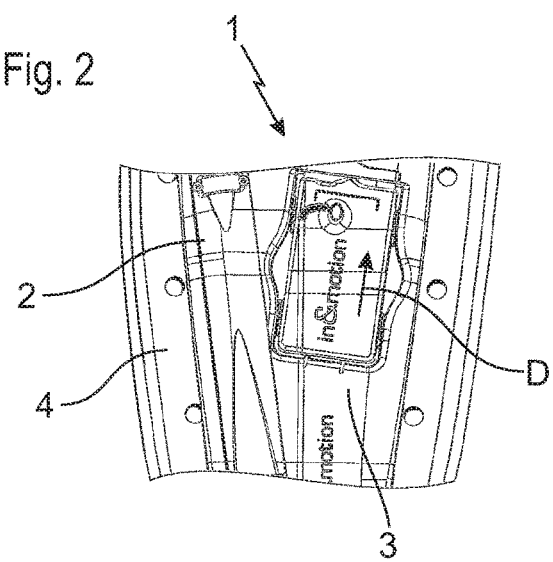
Figure 3:
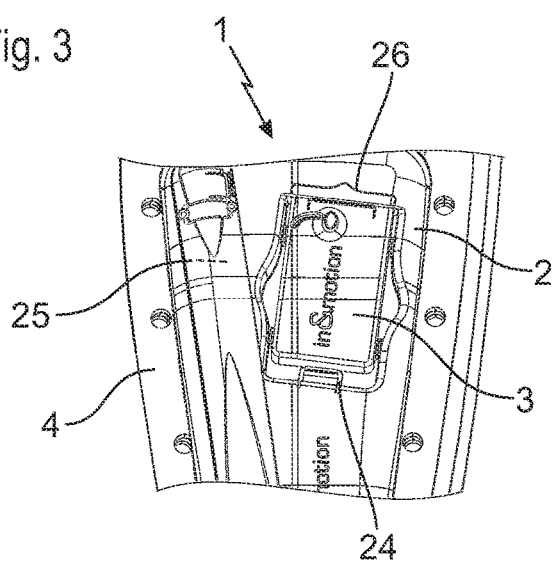

FIGS. 1 to 3 show an activation system 1 for deployment of an inflatable safety vest, net shown on the figures, Preferably for use by a skier, comprising a case 2 fixed to said inflatable vest and provided with a first opening 21 into which a box 3 containing the electronics can be reversibly placed, said first opening 21 comprising as the top part a housing 22 into which at least the top part 31 of the box 3 is inserted by an upwards movement to prevent trickling into the box (see direction D in FIG. 2).

In this description, the activation system 1 for deployment of an inflatable safety vest worn by a skier upright on horizontal ground will be described. Obviously, the skier can be in another position and in this case terms such as for example horizontal, vertical, upper, lower, top or bottom should be used.

Moreover, the term "reversibly" is used herein to denote the fact that the case 2 and the box 3 are designed to enable easy and fast placement (or on the contrary removal) of the box 3 in the case 2, these placement and removal operations possibly be done repeatedly with practically no limit to the number of these operations without damaging the case 2 or the box 3, and secondly can be done by anyone without any specific technical skills or special tools. In the case of a skier, these placement or removal operations can even be done when said skier is wearing gloves.

The first opening 21 comprises support rails 23 on each side of the first opening 21, to support the box 3 at the bottom of said first opening 21 and sliding of the box so that it can be inserted in the housing 22, and a flexible attachment element 24 located in the bottom part of the first opening 21 and looking said box 3 in the inserted position. Said support rails 23 and the flexible attachment element 24 guarantee perfect locking of the box 3 in the inserted position in the housing 22, even under extreme conditions of use, so that the activation system 1 according to the invention can perform its detection function and its activation function for deployment of the inflatable safety vest.

It is easy to understand that locking of the box 2 is also very easy and that operations to place and to remove the box 3 can be done very quickly, in less than 10 seconds, even when the skier is wearing gloves.

At the bottom of the housing 22, the case 2 comprises connection means not shown on the figures, to make the connection between the case and the box 3, said connection means advantageously comprising sealing elements made from plastic and foam shapes.

To facilitate installation, the connection means of the case 2 enable a wire type connection with the box 3.

However, it will be understood that the connection between the case 2 and the box 3 could be of the wireless type making use of technologies such as for example the Bluetooth® technology or the RFID (radio frequency identification) technology, without going outside the framework of the invention.

According to one preferred embodiment, the case 2 is fixed to a dorsal protection 4 fixed on said inflatable safety vest, located behind the skier's lumbar vertebrae when said vest is worn by the skier and is made from an absorbent foam. Said case 2 also comprises a second opening 25 to hold inflation means capable of generating or releasing gas for deployment of the safety vest, not shown on the figures, these means advantageously being a compressed gas cartridge.

According to one variant embodiment not shown, the inflation means are integrated into the box 3 and for example can be inserted in a recess made on said box 3.

The box 3 comprises an electronic card, not shown on the figures, including at least functions for movement analysis, detection of a risk situation in relation to several types of sensors, activation of inflation means that in the preferred embodiment consist of a fast release of gas contained in the compressed gas cartridge.

Said electronic board also comprises connection means and wireless communication means. The box 3 also comprises an energy storage device, not shown on the figures, advantageously of the rechargeable type capable of supplying energy to said electronic card to activate the inflation means.

The box 3 that has the global shape of a parallelepiped is nevertheless made asymmetric in its top part 31, this asymmetry being at least partly repeated on a pattern 26 made on the case 2, so that it can only be positioned and inserted in a single direction.

Furthermore, the longitudinal sides of the box 3 comprise attachment elements 32 designed to cooperate with and to be inserted in the support rails 23 of the case 2.

The upper part 31 of the box 2 comprises additional equipment such as at least one switch, a micro-USB port for charging the battery and transferring data to a computer, and a power supply connector for the inflation means. The shape of this additional equipment and said connection means between the box 3 and the case 2 is complementary to the shape of the sealing elements of the case 2 so as to guarantee an excellent seal between the case 2 and the box 3 when the box is inserted in the housing 2 and blocked in position by the support rails 23 and the flexible attachment element 24.

Furthermore, it will be understood that when the box 2 is inserted upwards and penetrates inside the housing 22 of the case 2, its upper part 31 is protected because it is covered by the wall of the housing 22 (see FIG. 2), the entire connection zone between said upper part 31 and the case 2 then being protected. Furthermore, even if the box 2 is removed, the connection means of the case 2 remain protected.

Thus, since it is particularly easy to put into place or remove the box 3 in the case 2, the skier can carry several boxes and replace then when the energy storage device of the box connected inside the case 2 is discharged. He or she can also recharge or update a box 3 while continuing to use the activation system 1 according to the invention and the associated safety vest.

POSSIBILITY OF INDUSTRIAL APPLICATION

It will be understood that the activation system 1 for deployment of an inflatable safety vest according to the invention is preferably for use by skiers. However, it is obvious that the activation system 1 according to the invention can be adapted to and used for inflatable safety vests, for example worn by a motorcyclist.

Finally, it is obvious that the examples of the activation system 1 for deployment of an inflatable safety vest according to the invention as described above are simply particular illustrations and are not in any way limitative of the invention.

The invention claimed is:

1. A displacement activation system for activating the deployment of an inflatable safety vest, comprising:
a case designed to be fixed to said inflatable safety vest and equipped with a first opening into which a box can be removably inserted, said box comprising at least one electronic card, a box connection mechanism and an energy storage device, an upper part of said first opening being provided with a housing within which is disposed a case connection mechanism for connecting the case and the box; wherein at least an upper part of the box is configured to be inserted into the housing so that it is hermetically connected to said case.

2. The displacement activation system according to claim 1, wherein said case connection mechanism comprises sealing elements made from at least one of plastic and foam shapes.

3. The displacement activation system according to claim 2, wherein the box connection mechanism is located on the upper part of the box and their shape is complementary to the shape of sealing elements of the case.

4. The displacement activation system according to claim 1, wherein the first opening comprises support rails on each side of the first opening, to support the box at the bottom of said first opening while allowing sliding of the box so that it can be inserted in the housing, and a flexible attachment element located in the bottom part of the first opening and locking said box in the inserted position.

5. The displacement activation system according to claim 4, wherein the box comprises attachment elements designed to cooperate with and to be inserted in the support rails of the case.

6. The displacement activation system according to claim 1, wherein the shape of the upper part of the box is asymmetric so that it is only possible to position it and insert it in one direction.

7. The displacement activation system according to claim 6, wherein the asymmetric shape of the upper part of the box is at least partly repeated on a pattern made on the case.

8. The displacement activation system according to claim 1, wherein the case is fixed to a dorsal protection made of an absorbent material arranged to be fixed on said inflatable safety vest behind the lumbar vertebrae of a skier when the skier is wearing said safety vest.

9. The displacement activation system according to claim 1, wherein said case comprises a second opening into which an inflation mechanism can be reversibly placed to generate or release gas to enable deployment of the safety vest.

10. The displacement activation system according to claim 9, wherein the inflation mechanism is a compressed gas cartridge.

* * * * *